United States Patent
Chen et al.

(10) Patent No.: US 6,910,583 B2
(45) Date of Patent: Jun. 28, 2005

(54) APPARATUS FOR CARRYING SUBSTRATES

(75) Inventors: Chien Chih Chen, Tainan (TW); Chien Chih Lu, Banchiau (TW); Wu Sung Chou, Hsinchu (TW); Huan Ming Wen, Miaoli (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 10/720,132

(22) Filed: Nov. 25, 2003

(65) Prior Publication Data
US 2004/0222126 A1 Nov. 11, 2004

(30) Foreign Application Priority Data

May 9, 2003 (TW) ........................................ 92112670 A

(51) Int. Cl.⁷ .............................................. B65D 85/30
(52) U.S. Cl. ...................... 206/707; 206/722; 206/454; 206/561; 211/41.17
(58) Field of Search ................................ 206/449, 454, 206/456, 561, 564, 707, 711, 712, 722, 723, 832; 211/41.1, 41.14, 41.17, 41.18

(56) References Cited

U.S. PATENT DOCUMENTS

| | | | | |
|---|---|---|---|---|
| 3,682,083 A | * | 8/1972 | Puente | .................. 396/654 |
| 3,877,134 A | * | 4/1975 | Shanahan | .................. 29/417 |
| 4,153,164 A | * | 5/1979 | Hofmeister et al. | ...... 211/41.18 |
| 4,600,231 A | * | 7/1986 | Sickles | .................. 294/161 |
| D292,743 S | * | 11/1987 | Hung | .................. D3/315 |
| 4,930,634 A | * | 6/1990 | Williams et al. | ............ 206/454 |
| 5,638,958 A | * | 6/1997 | Sanchez | .................. 206/710 |
| 6,036,031 A | * | 3/2000 | Ishikawa | .................. 211/41.18 |
| 6,430,046 B1 | * | 8/2002 | Komatsu | .................. 361/690 |
| 2004/0069732 A1 | * | 4/2004 | Huang et al. | ............... 211/183 |

* cited by examiner

*Primary Examiner*—Mickey Yu
*Assistant Examiner*—Jerrold Johnson
(74) *Attorney, Agent, or Firm*—Bacon & Thomas

(57) ABSTRACT

A substrate carrying device is disclosed. The substrate carrying device, in cooperation with at least a substrate, comprises two end plates having a plurality of fixing holes and mounting holes, at least two partition plates each having side faces, side edges and a plurality of parallel slots wherein the parallel slots are formed on each side face of the partition plate to receive the substrate, a plurality of assembling units, a plurality of fixing poles having binding holes, and at least a bottom rail having a plurality of fixing pins. The substrate carrying device is capable of strengthening the structure of the device, protecting the substrates, simplifying adjustment of the size of the device, and facilitating draining and stacking.

9 Claims, 5 Drawing Sheets

APPARATUS FOR CARRYING SUBSTRATES

BACKGROUND OF THE INVENTION

1. Field of the Invention

The present invention relates to an apparatus for carrying substrates, and more particularly to a cassette device for carrying a number of substrates in fabricating liquid crystal display panels.

2. Description of Related Art

In the present flat panel display (such as liquid crystal display) fabs, to facilitate the transfer or storage of the panels and prevent the substrate from being contaminated, it is common to insert the panels into a cassette having slots arranged in order. Hence, the panels are transported to the next processing step. Alternatively, the panels in bulk are transferred to a predetermined position of an apparatus during a processing step by means of a robot arm equipped with the apparatus, wherein the panels are picked up by the robot arm and transferred to a processing chamber of the apparatus. In some cases, the cassette carrying the panels in bulk is transferred to the processing chamber of the apparatus so that the panels in bulk are processed simultaneously.

FIG. 6 shows the currently available cassette, wherein a cassette 600 is generally assembled with screws 610. A large number of screws 610 need to be used in this case, hence, the assembly is time-consuming and causes difficulty in maintenance. For example, bottom supporting rails 620 are securely engaged with end plates 630 by means of the screws. The screws tend to become loose after the cassette has been used for a long time, resulting in substrates 640 in bulk falling from the cassette and breaking. On the other hand, the slots of partition plates 650 are below the end of wires of transistors at the periphery of the substrates 640, hence, the wires are susceptible to being scratched during loading/unloading of the panels, bringing expense through waste panels. Furthermore, in the known cassette 600 where the substrates 640 are loaded, the substrates 640 project out of the cassette 600 without any protection. Hence, the substrates 640 are susceptible to hitting against an outside object and breaking. Further, due to the projection of the panels, the cassettes cannot be stacked. Thus, an excessive area of a clean room is occupied by the cassettes in stock. Further, drain holes at the bottom of the cassette are poorly designed, and thus, water is accumulated after cleaning process. Accordingly, it is difficult to keep the cassette dry.

Therefore, it is desirable to provide a substrate carrying devise to mitigate and/or obviate the aforementioned problems.

SUMMARY OF THE INVENTION

The primary objects of the present invention are to provide a substrate carrying device so as to strengthen the structure of the device, protect the substrates, simplify adjustment of the size of the device, facilitate draining and stacking, reduce the possibility of substrate breakage or wire scratch, and increase flexibility in usage.

To attain the above objects, a substrate carrying device according to the present invention, in cooperation with at least one substrate, comprises two end plates having a plurality of fixing holes and mounting holes defined in the two end plates; at least two partition plates each having side faces, side edges and a plurality of parallel slots wherein the parallel slots are formed on each side face of the partition plates to receive the substrate, and at least a mounting pin is disposed on one side edge of the partition plate to securely fix the partition plates in the mounting holes and firmly hold the partition plates between the two end plates; a plurality of assembling units; a plurality of fixing poles having binding holes for locking engagement with the assembling units so that the fixing poles are secured between the two end plates; and at least one bottom rail having a plurality of fixing pins at two ends thereof wherein the bottom rail is secured between the end plates and the partition plates by means of the fixing pins to support the substrate.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
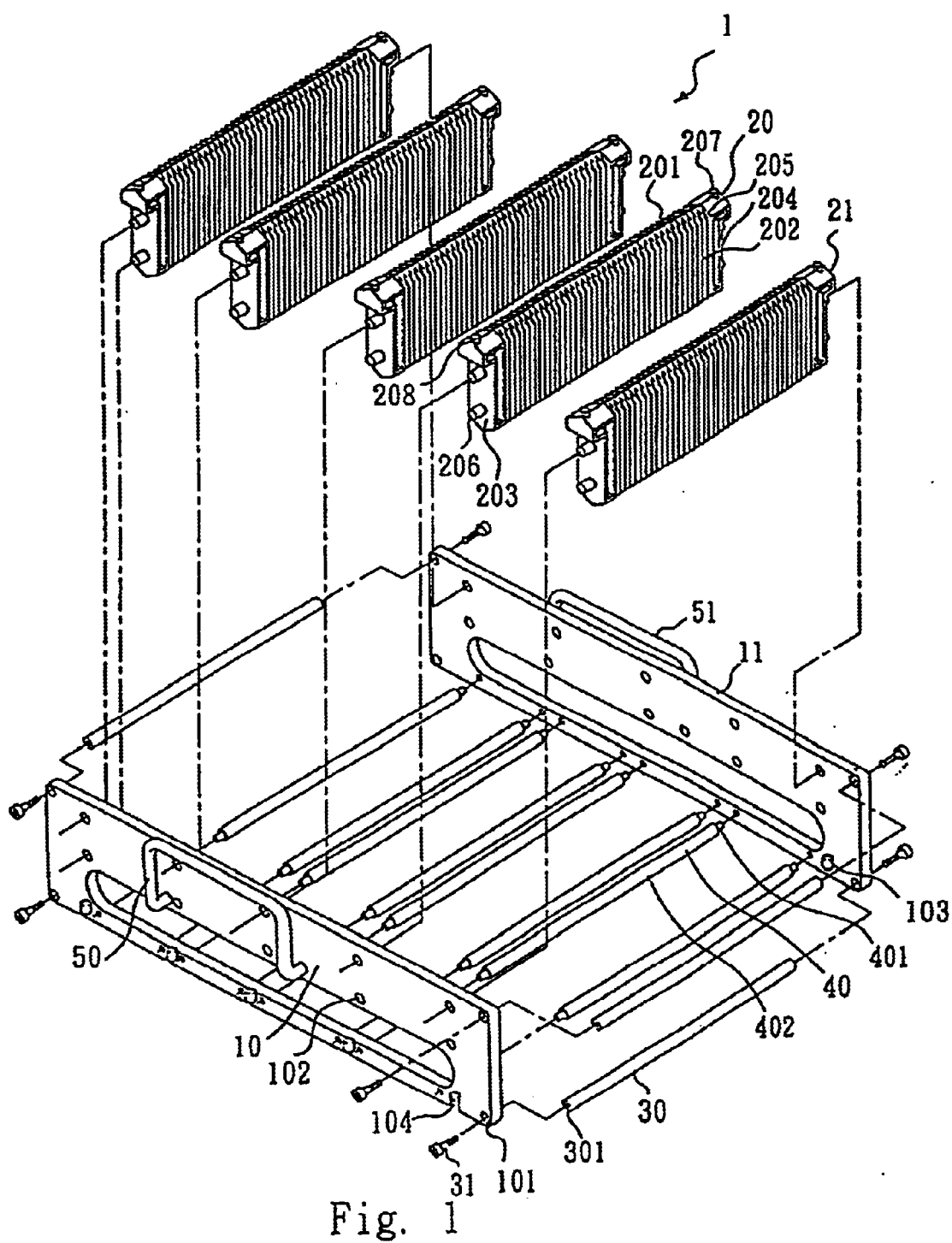
FIG. 1 is a perspective view of a substrate carrying device before assembly according to the present invention.

Referring to FIG. 1, a perspective view of a substrate carrying device before assembly according to the present invention is shown. A substrate carrying device 1 comprises end plates 10, 11 having a plurality of fixing holes 101 defined at the peripheries of the end plates 10, 11 and a plurality of mounting holes 102, 103, 104 wherein the fixing holes 101 and the mounting holes 102 are indented into the end plates in the horizontal direction and the mounting holes 103, 104 are indented into the end plates in the vertically upward direction; a plurality of partition plates 20 each having two side faces 201, 202, two side edges 203, 204, and two stacking pins 207, 208 for stacking; wherein a plurality of parallel slots 205 is formed on the side faces 201, 202 to receive substrates, two mounting pins 206 are formed on the side edges 203, 204 so that the mounting pins 206 are inserted into the mounting holes 102 to secure the partition plates 20 between the end plates 10, 11, and the stacking pins 207, 208 are secured into the mounting holes 103, 104 respectively so that the end plates can be stacked in the vertical direction and that the carrying devices after assembly can be stacked; a plurality of fixing poles 30 having a screwing hole 301 at each end thereof for locking engagement with a screw 31 so that the end plates 10, 11 are securely engaged at the two ends of the fixing poles 30; and a plurality of bottom rails 40 for supporting the substrates wherein the bottom rails 40 are secured between the end plates 10, 11 and the partition plates 20, 21 with fixing pins 401 mounted at the two ends of each of the bottom rails 40, and the surface of the bottom rails 40 is enclosed with a glue layer 402 for preventing the substrates being loaded in the substrate carrying device 1 from hitting directly against the bottom rails 40. The substrate carrying device 1 further comprises two lugs 50, 51 securely mounted on the end plates 10, 11 with screws to facilitate transportation of the substrate carrying device 1.

Figure 2:
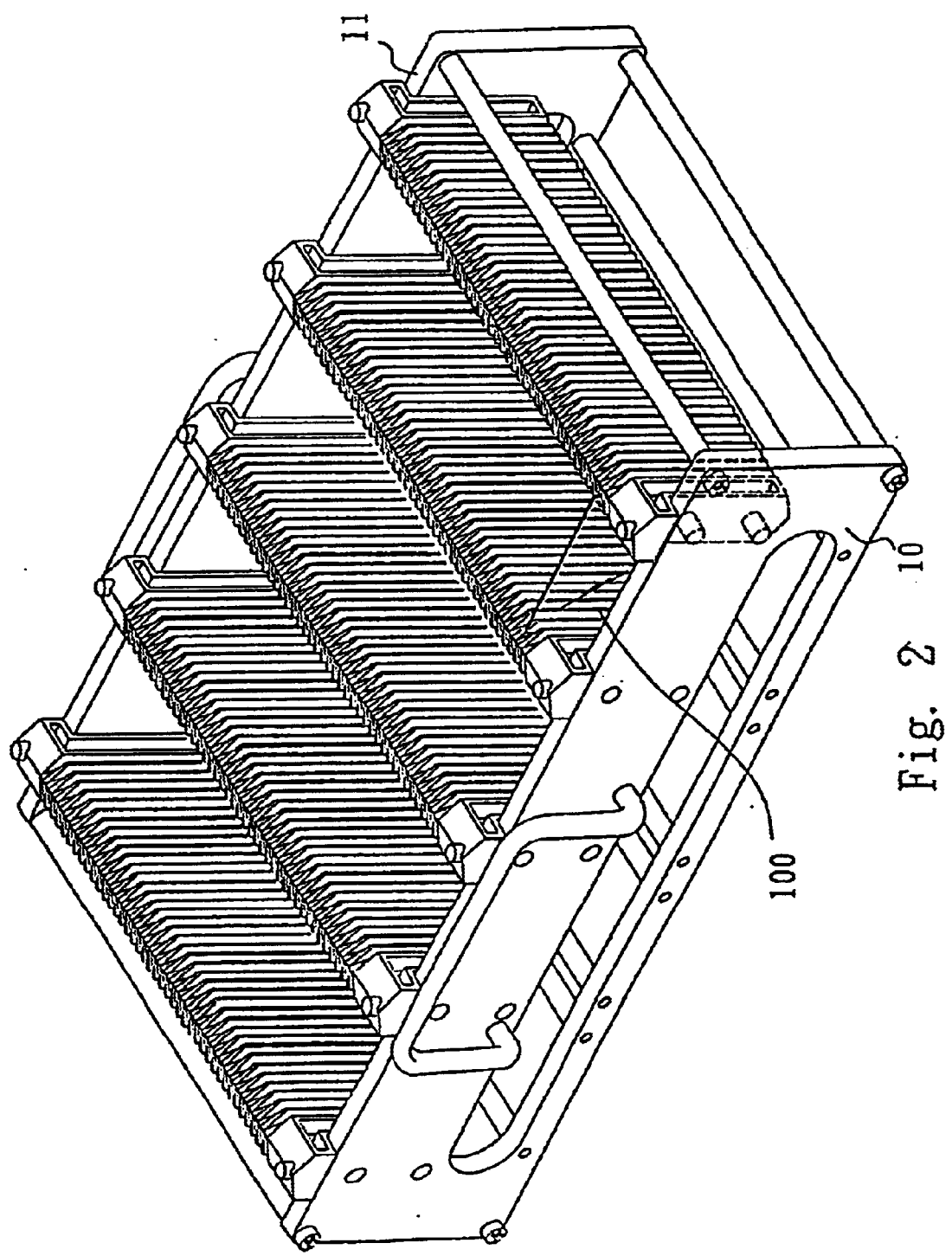
FIG. 2 is a perspective view of a substrate carrying device after assembly according to the present invention.
Figure 3:
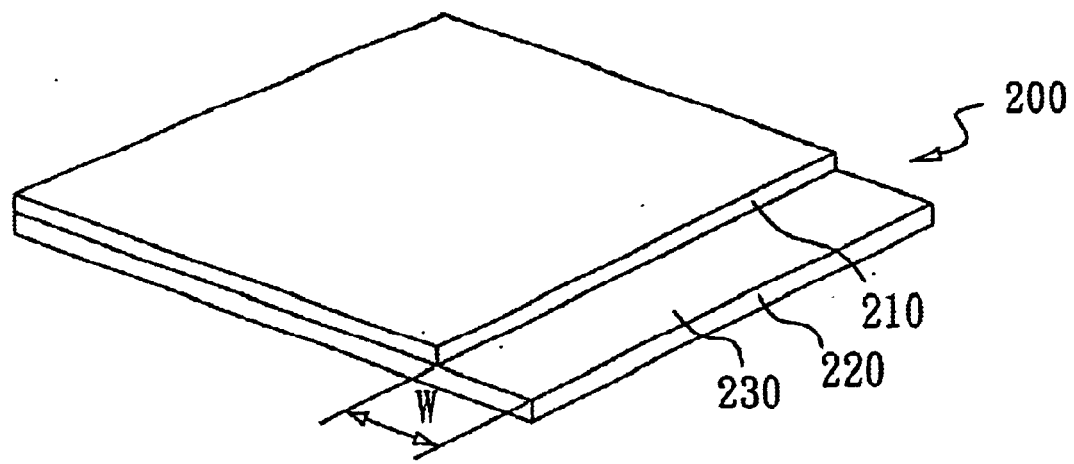
FIG. 3 is a perspective view of a liquid crystal panel according to a preferred embodiment of the present invention.
Figure 4:
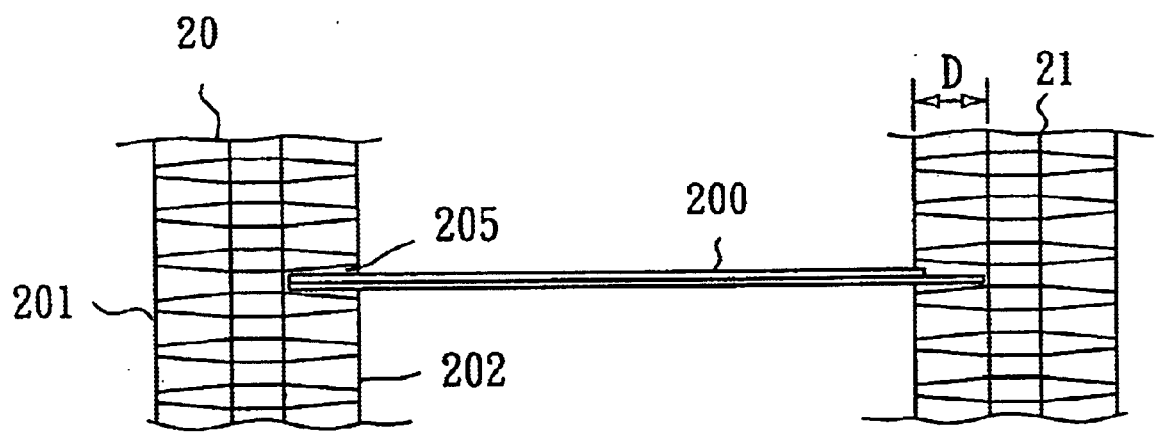
FIG. 4 is a schematically enlarged view of a substrate disposed in partition plates according to a preferred embodiment of the present invention.
Figure 5:
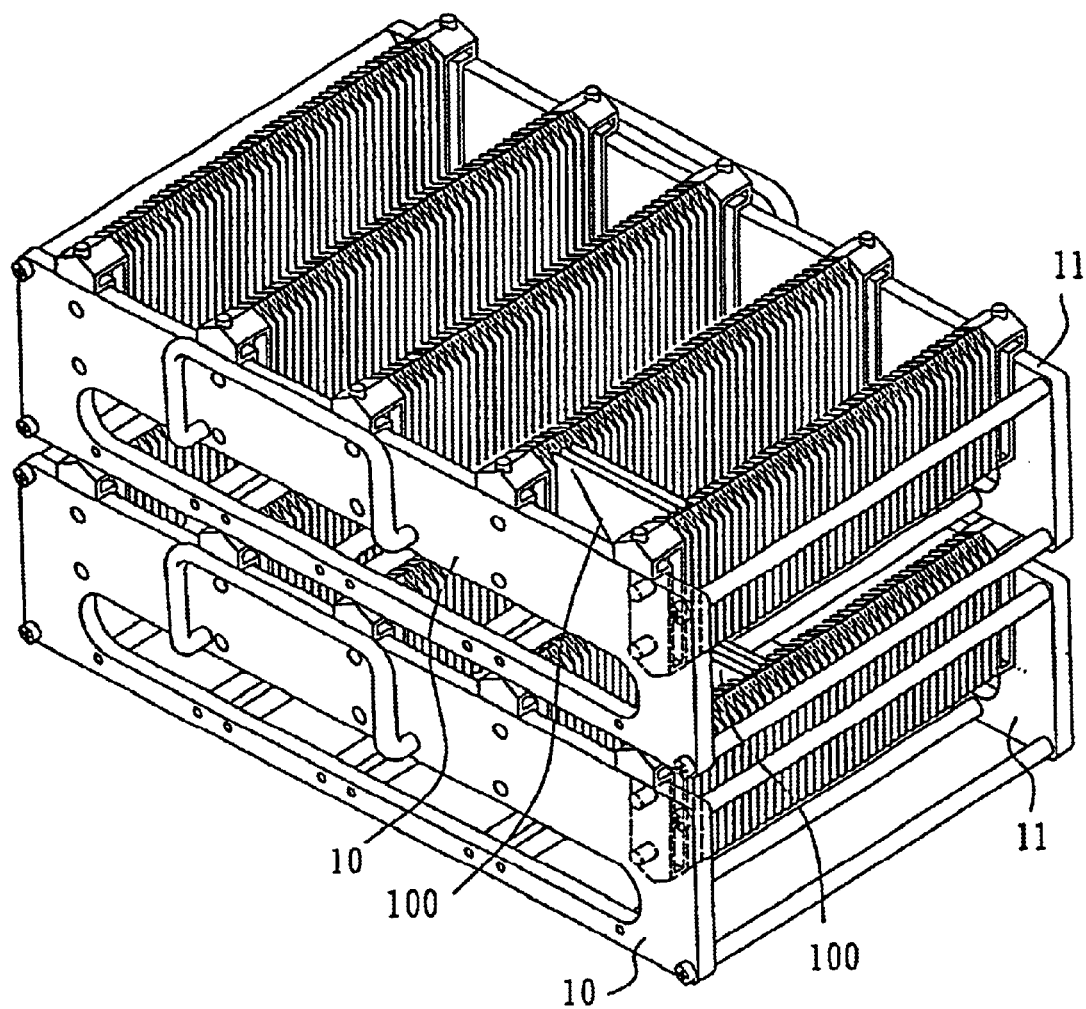
FIG. 5 is a view showing a stacked assembly of substrate carrying devices according to a preferred embodiment of the present invention.
Figure 6:
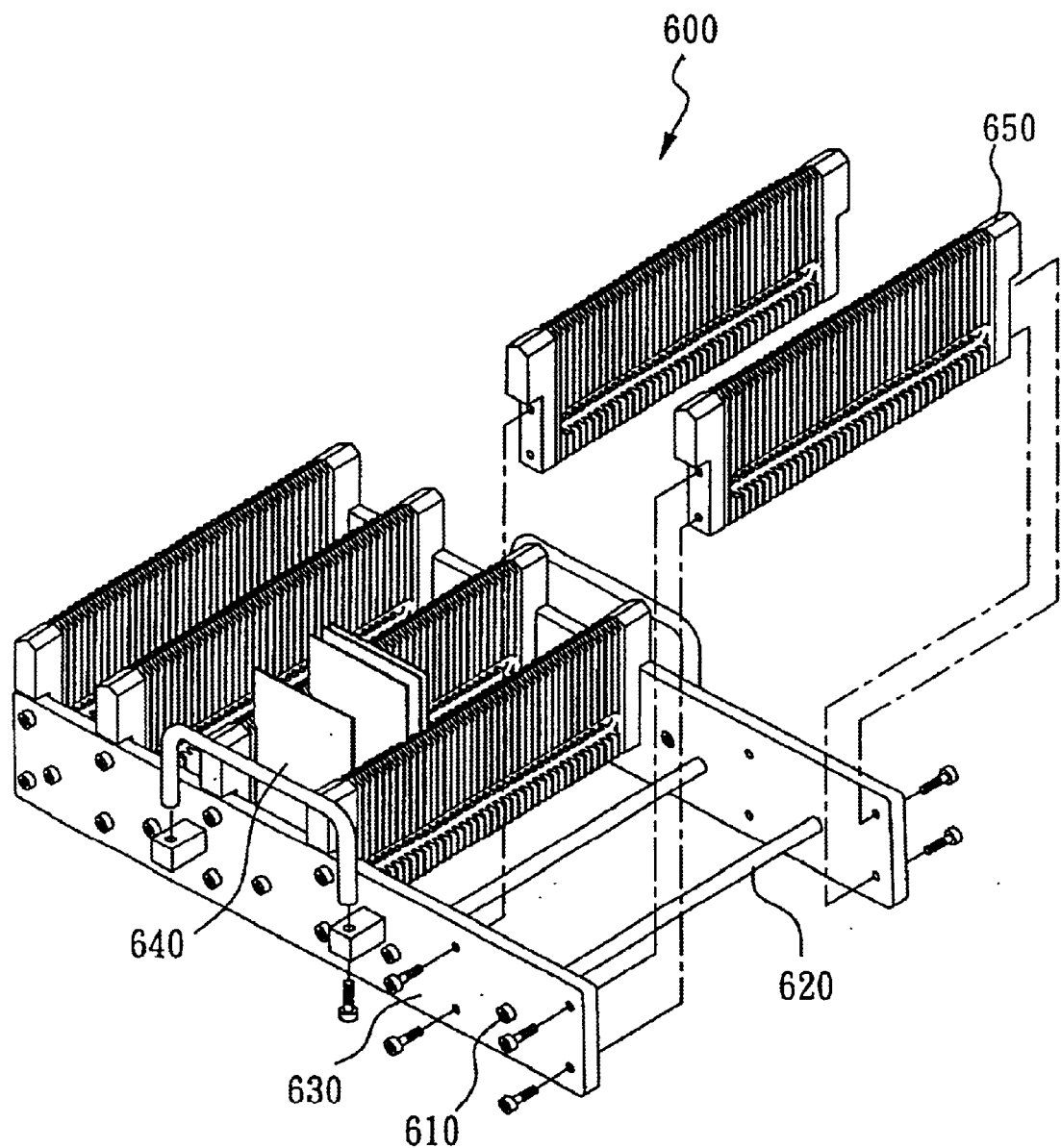
FIG. 6 is a perspective view of a prior substrate carrying cassette.

Referring next to FIG. 2, a perspective view of a substrate carrying device after assembly according to the present invention is shown. A substrate 100 such as glass plate, silicon substrate or liquid crystal panel is disposed in the substrate carrying device as shown in FIG. 2. As such, wires at the periphery of the substrate will be exposed. As shown in FIG. 3, a liquid crystal panel 200 includes an upper substrate 210 and a lower substrate 220 on which an exposure area 230 of wires is formed. The exposure area 230 has a width W. Referring to FIG. 4, an enlarged view of the substrate disposed in the partition plates is shown. As the liquid crystal panel 200 is disposed in the substrate carrying device in the prior art, the depth D of the slots 205 is shorter than the width W of the wire exposure area 230. Hence, the wires on the exposure area 230 are susceptible to being scratched in loading/unloading the liquid crystal panel 200, resulting in damage to the liquid crystal panel 200. To avoid this problem, the depth D of the slots is designed to be longer than the width W of the wire exposure area 230 in the present invention. In this connection, the size of the end plates and the positions of the fixing holes and the mounting holes can be adjusted in accordance with the size of the substrate to accommodate substrates of different sizes. In addition, the heights of the assembly of the partition plates and the end plates are higher than that of the substrate. Hence, the substrate disposed in the substrate carrying device is below the partition plates to facilitate stacking of the substrate carrying devices in the vertical direction, as shown in FIG. 5. As a result, the space occupied by the substrate carrying device of the present invention can be reduced within the clean room, and also, the substrates are safe from being damaged.

The present invention provides a substrate carrying device having the following advantages:

1. Compact Design

Except the end plates, all the components of the present substrate carrying device can be used for carrying substrates of different sizes. The flexibility in employing the components is thus increased.

2. Substrate Protection

The size of the two end plates and the positions of the fixing holes and the mounting holes can be adjusted in accordance with the size of the substrate to be well suited to substrates of different sizes. Also, the increase in the height of the end plates in an appropriate manner can indirectly increase the height of the partition plates so that the substrate is below the partition plates and is protected by the partition plates.

3. Secured Assembly

The number of screws used is reduced by snap lock assembly. Also, an arrangement for preventing the screws from becoming loose is provided.

4. Wire Protection, Good Draining and Easy Drying

With the increase in the depth of the slots of the partition plates, the wires of the substrate are completely covered within the slots to prevent the substrate from being scratched during loading/unloading of the substrate. Also, the bottom of the partition plates is left empty which provides good drainage for the substrate carrying device, and ensures it is easy to keep the substrate carrying device dry.

5. Storage in Stacks

The mounting holes are disposed at the bottom of the end plates so that the mounting pins of the partition plates for stacking are secured and that the substrate carrying devices can be stored in stacks. Also, the space occupied by the substrate carrying device is reduced within the clean room.

6. Proof-of-impact

The glue layer encloses the surface of the bottom rails to prevent the substrate from being damaged by hitting against the bottom rails.

Although the present invention has been explained in relation to its preferred embodiment, it is to be understood that many other possible modifications and variations can be made without departing from the spirit and scope of the invention as hereinafter claimed.

What is claimed is:

1. A substrate carrying device, in cooperation with at least a substrate, comprising:

two end plates having a plurality of fixing holes and mounting holes defined in the two end plates;

at least two partition plates each having side faces, side edges and a plurality of parallel slots wherein said parallel slots are formed on each side face of said partition plates to receive said substrate, and at least a mounting pin is disposed on one side edge of said partition plate to securely fix said partition plates in said mounting holes and firmly hold said partition plates between said two end plates;

a plurality of assembling units;

a plurality of fixing poles having binding holes for locking engagement with said assembling units so that said fixing poles are secured between said two end plates; and at least a bottom rail having a fixing pin at each end thereof wherein said bottom rail is secured between said end plates and said partition plates by means of said fixing pins to support said substrate.

2. The substrate carrying device of claim 1, wherein said substrate is a glass plate, a silicon substrate or a liquid crystal panel.

3. The substrate carrying device of claim 1, wherein said fixing holes are defined at the peripheries of said end plates.

4. The substrate carrying device of claim 2, wherein said substrate is a panel for flat displays having a wiring area wherein the distance from said wiring area to the periphery of said liquid crystal panel is less than the depth of said slots of said partition plates.

5. The substrate carrying device of claim 1, wherein said partition plates further comprises at least two stacking pins for being secured in said mounting holes so that said carrying devices can be stacked.

6. The substrate carrying device of claim 1, wherein said partition plates are higher than said substrate.

7. The substrate carrying device of claim 1, wherein a surface of said bottom rails is enclosed with a glue layer for preventing or reducing impact caused by said bottom rails to said substrate.

8. The substrate carrying device of claim 1, wherein said end plates further comprises at least two lugs to facilitate transportation.

9. The substrate carrying device of claim 1, wherein said assembling units are screws.

* * * * *